(12) United States Patent
Fang et al.

(10) Patent No.: US 6,388,460 B1
(45) Date of Patent: May 14, 2002

(54) ALTERNATE TIMING WAFER BURN-IN METHOD

(75) Inventors: Walx Fang, Kaohsiung; Charlie Han, Hsinchu Hsien, both of (TW)

(73) Assignee: United Microelectronics Corp., Hsinchu (TW)

( * ) Notice: Subject to any disclaimer, the term of this patent is extended or adjusted under 35 U.S.C. 154(b) by 32 days.

(21) Appl. No.: 09/698,713

(22) Filed: Oct. 27, 2000

(30) Foreign Application Priority Data

Oct. 16, 2000 (TW) ........................................ 89121546 A

(51) Int. Cl.[7] ............................................... G01F 31/02
(52) U.S. Cl. .................... 324/760; 324/158.1; 365/201; 365/149
(58) Field of Search .............................. 324/760, 158.1, 324/765; 365/201, 149; 714/18, 14, 724

(56) References Cited

U.S. PATENT DOCUMENTS

RE37,072 E * 2/2001 Gillingham .................. 355/149
6,188,622 B1 * 2/2001 Beigel et al. ................ 365/201

* cited by examiner

*Primary Examiner*—Michael J. Sherry
*Assistant Examiner*—Jimmy Nguyen
(74) *Attorney, Agent, or Firm*—Charles C. H. Wu; Charles C. H. Wu & Associates

(57) ABSTRACT

An alternate-timing burn-in method suitable for testing a plurality of memory units on a wafer and capable of preventing any idling due to direct current timing. A first bit line voltage clocking signal is generated and sent to one terminal of any memory unit. A second bit line voltage clocking signal is generated and sent to the other terminal of the same memory unit. In addition, the edge of the second bit line voltage clocking signal corresponds to the mid-point of the first bit line voltage clocking signal.

5 Claims, 4 Drawing Sheets

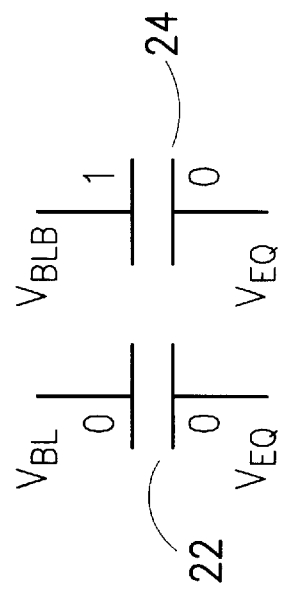
FIG. 2B
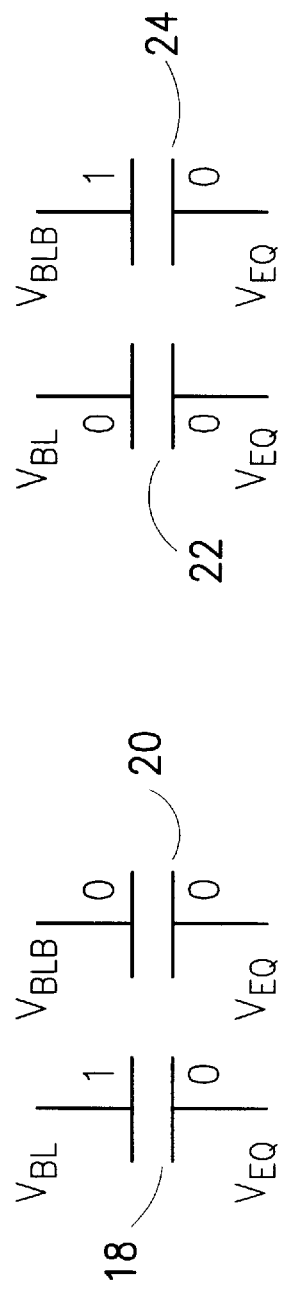
FIG. 2A
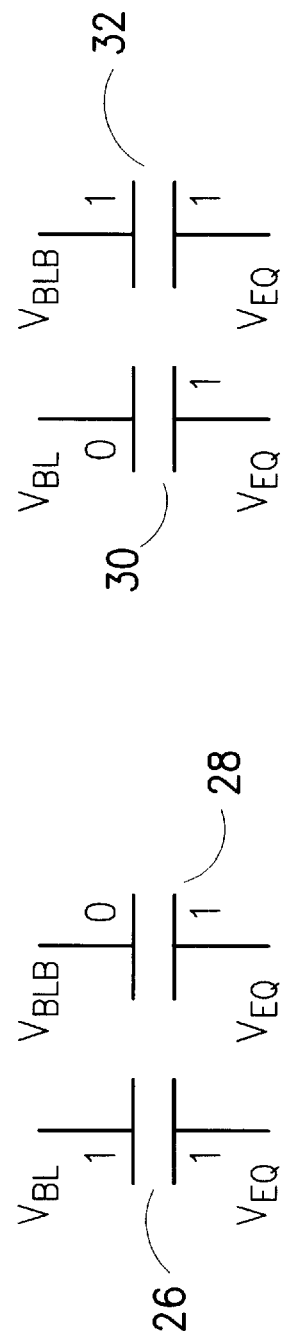
FIG. 2D
FIG. 2C

ALTERNATE TIMING WAFER BURN-IN METHOD

CROSS-REFERENCE TO RELATED APPLICATION

This application claims the priority benefit of Taiwan application serial no. 89121546, filed Oct. 16, 2000.

BACKGROUND OF THE INVENTION

1. Field of Invention

The present invention relates to a wafer burn-in method. More particularly, the present invention relates to a wafer burn-in method that uses alternate timing.

2. Description of Related Art

In the manufacturing of semiconductor chips, various integrated circuits are formed on a wafer. The wafer is then cut out and sealed to form integrated circuit packages to be sold in the market.

Because each integrated circuit has its own characteristic properties, internal circuitry has to be checked to decide the quality of the chip. Conventionally, testing is conducted after the silicon chip is sealed. To test the package, voltages are applied to various exposed leads and measured. This process is commonly referred to as package burn-in. However, information regarding the quality of the chip is only obtained after packaging. Hence, packaging material and many processing steps are wasted whenever a sub-quality chip is found. To prevent the above problem, wafer burn-in is conducted in the wafer stage where probes are attached to the bonding pads of a wafer to carry out electrical testing. Any problem on a wafer can be found and tagged before packaging.

To develop memory cell stress during wafer burn-in, considerable time is required. Hence, DC timing must be used to prolong bit line conductance. FIG. 1 is a timing diagram showing voltage variation of various input terminals. As shown in FIG. 1, voltage source VCC, word line voltage VW, word line conduct timing WL are at a high potential state. Because of the use of DC timing and the need for stressing the bit-line and the bit-line bar, the state of bit line voltage VBL and lower electrode voltage VEQ can be arranged into four types of combinations.

The effects of each of the four combinations are further explained below using the capacitor of a DRAM as an illustration. FIGS. 2A through 2D show the four combinations of states for the bit-line and the bit-line bar.

First, in the first combination 10 shown in FIG. 1, the bit line voltage VBL and the lower electrode voltage VEQ are at logic level '1' and '0' respectively. Hence, in FIG. 2A, since the upper electrode of the capacitor 18 is connected to the bit line voltage VBL, the upper electrode is at a potential level of '1' potential (a high voltage state). On the other hand, since the lower electrode of the capacitor 18 is connected to the lower electrode voltage VEQ, the lower electrode is at a potential level of '0' (a low voltage state). Thus, a stress from the upper electrode to the lower electrode (up/down direction) is created. Similarly, since the upper electrode of the capacitor 20 is connected to the bit line bar voltage VBLB, the upper electrode is at a potential level of '0' (a low voltage state). Since the lower electrode is connected to the lower electrode voltage VEQ, the lower electrode is at a potential of '0' (a low voltage state). Consequently, the capacitor 20 is in an idle state without any stress.

In the second combination 12 shown in FIG. 1, both the bit line voltage VBL and the lower electrode voltage VEQ are at logic level '0'. Hence, in FIG. 2B, since the upper electrode of the capacitor 22 is connected to the bit line voltage VBL, the upper electrode is at a potential level of '0' potential (a low voltage state). Since the lower electrode of the capacitor 22 is connected to the lower electrode voltage VEQ, the lower electrode is at a potential level of '0' (a low voltage state). Thus, the capacitor 22 is in an idle state without any stress. Similarly, since the upper electrode of the capacitor 24 is connected to the bit line bar voltage VBLB, the upper electrode is at a potential level of '1' (a high voltage state). Since the lower electrode is connected to the lower electrode voltage VEQ, the lower electrode is at a potential of '0' (a low voltage state). Consequently, a stress from the upper electrode to the lower electrode (up/down direction) is created.

In the third combination 14 shown in FIG. 1, both the bit line voltage VBL and the lower electrode voltage VEQ are at logic level '1'. Hence, in FIG. 2C, since the upper electrode of the capacitor 26 is connected to the bit line voltage VBL, the upper electrode is at a potential level of '1' potential (a high voltage state). Since the lower electrode of the capacitor 26 is connected to the lower electrode voltage VEQ, the lower electrode is at a potential level of '1' (a high voltage state). Thus, the capacitor 26 is in an idle state without any stress. Similarly, since the upper electrode of the capacitor 28 is connected to the bit line bar voltage VBLB, the upper electrode is at a potential level of '0' (a low voltage state). Since the lower electrode is connected to the lower electrode voltage VEQ, the lower electrode is at a potential of '1' (a high voltage state). Consequently, a stress from the lower electrode to the upper electrode (down/up direction) is created.

In the fourth combination 16 shown in FIG. 1, the bit line voltage VBL and the lower electrode voltage VEQ are at a logic level '0' and a logic level '1' respectively. Hence, in FIG. 2D, since the upper electrode of the capacitor 30 is connected to the bit line voltage VBL, the upper electrode is at a potential level of '0' potential (a low voltage state). Since the lower electrode of the capacitor 30 is connected to the lower electrode voltage VEQ, the lower electrode is at a potential level of '1' (a high voltage state). Thus, a stress from the lower electrode to the upper electrode (down/up direction) is created. Similarly, since the upper electrode of the capacitor 32 is connected to the bit line bar voltage VBLB, the upper electrode is at a potential level of '1' (a high voltage state). Since the lower electrode is connected to the lower electrode voltage VEQ, the lower electrode is also at a potential of '1' (a high voltage state). Consequently, the capacitor 32 is in an idle state without any stress.

Following from the aforementioned description, if both the bit-line and the bit-line bar are subjected to a stress, idle state occurs half of the time. Ultimately, burn-in test efficiency is cut in half.

SUMMARY OF THE INVENTION

Accordingly, one object purpose of the present invention is to provide a wafer burn-in method that uses alternate timing to prevent idling state and increase operating efficiency.

To achieve these and other advantages and in accordance with the purpose of the invention, as embodied and broadly described herein, the invention provides an alternate timing burn-in method suitable for testing a memory unit on a wafer. First, a first bit line voltage clocking signal is generated and sent to one end of the memory unit. A second bit line voltage clocking signal is generated and sent to the other end of the memory unit. The edge of the second bit line voltage clocking signal corresponds to the mid-point of the first bit line voltage clocking signal. The clocking rate of the first bit line voltage clocking signal and the second bit line voltage clocking signal is at the highest frequency of a station. The memory unit can be a capacitor with the first bit line voltage clocking signal sent to the upper electrode of the capacitor while the second bit line voltage clocking signal sent to the lower electrode of the capacitor.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

FIGS. 2A through 2D show the four combinations of states for the bit-line and the bit-line bar;

DESCRIPTION OF THE PREFERRED EMBODIMENTS

Figure 1:
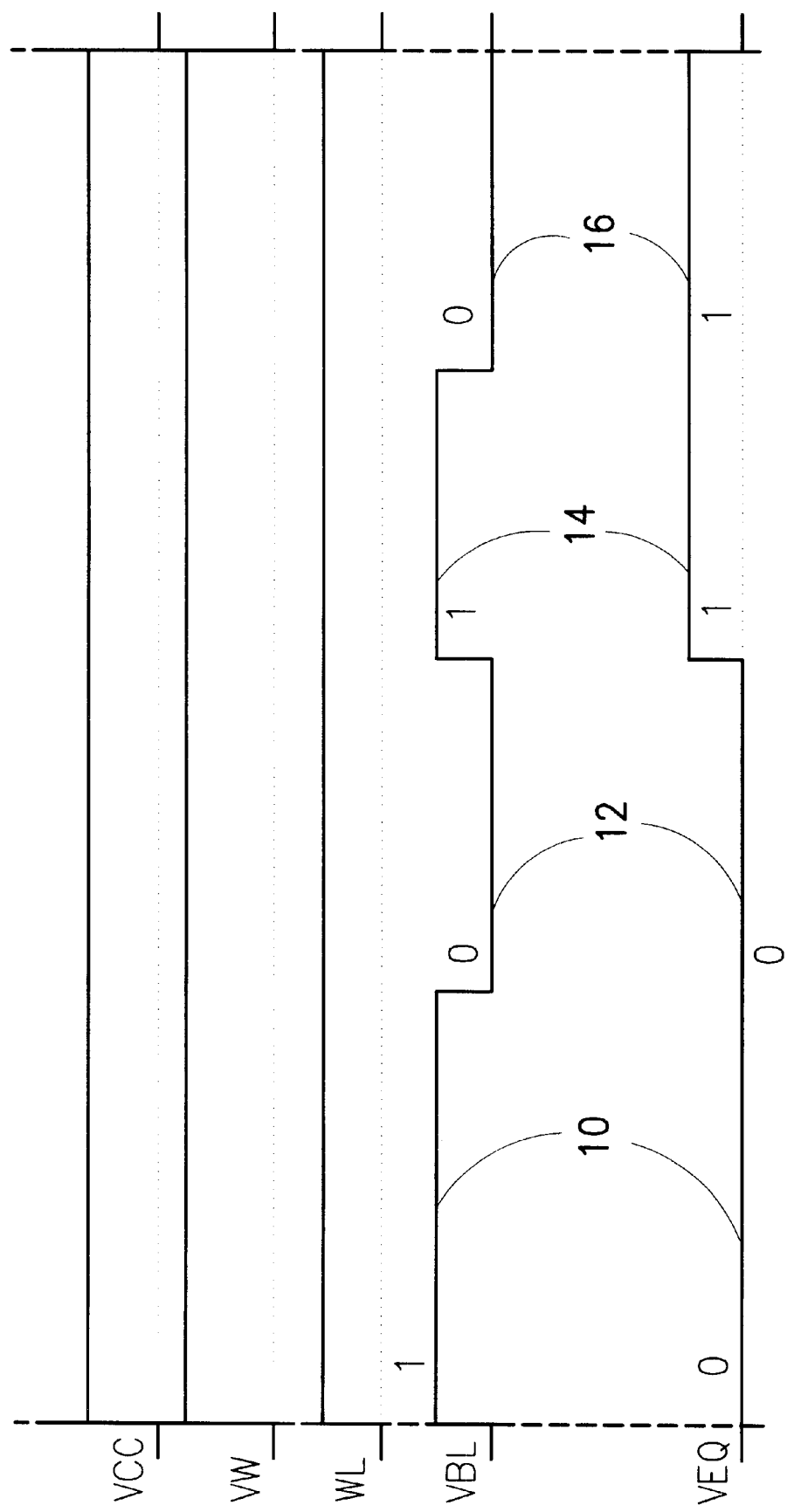
FIG. 1 is a timing diagram showing voltage variation of various input terminals.

Reference will now be made in detail to the present preferred embodiments of the invention, examples of which are illustrated in the accompanying drawings. Wherever possible, the same reference numbers are used in the drawings and the description to refer to the same or like parts.

Figure 3:
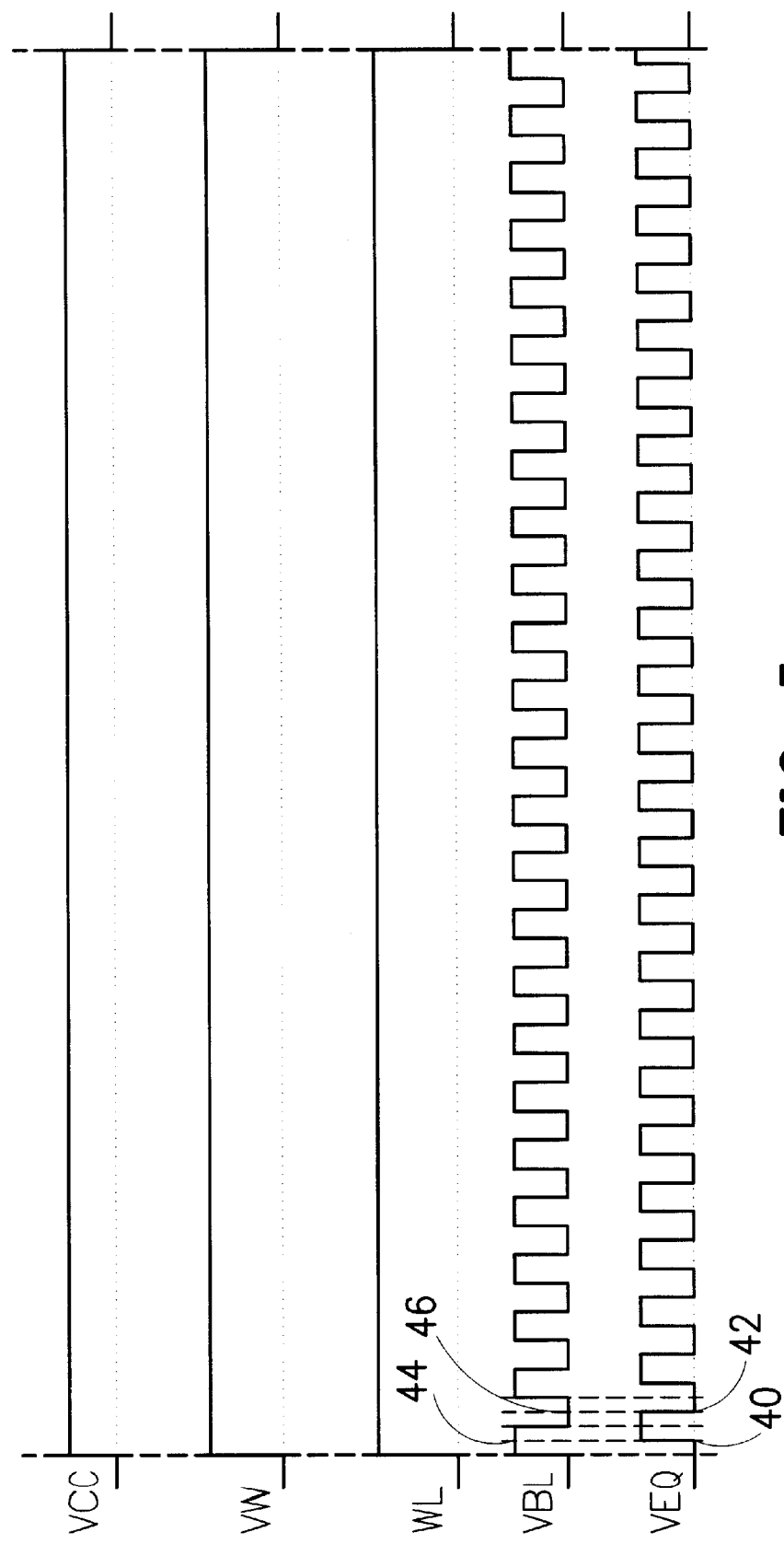
FIG. 3 is a timing diagram showing voltage variation of various input terminals according to an alternate-timing burn-in method of this invention.

FIG. 3 is a timing diagram showing voltage variation of various input terminals according to an alternate-timing burn-in method of this invention. As shown in FIG. 3, voltage source VCC, word line voltage VW, word line conduct timing WL are all at a high potential state, identical to the one shown in FIG. 1. In this invention, a first bit line voltage clocking signal VBL and a second bit line voltage clocking signal VEQ are supplied to a first and a second terminal of any memory unit. The edge 40 (or 42) of the second bit line clocking signal VEQ corresponds with a mid-point 44 (or 46) of the first bit line voltage clocking signal VBL.

Figure 4:
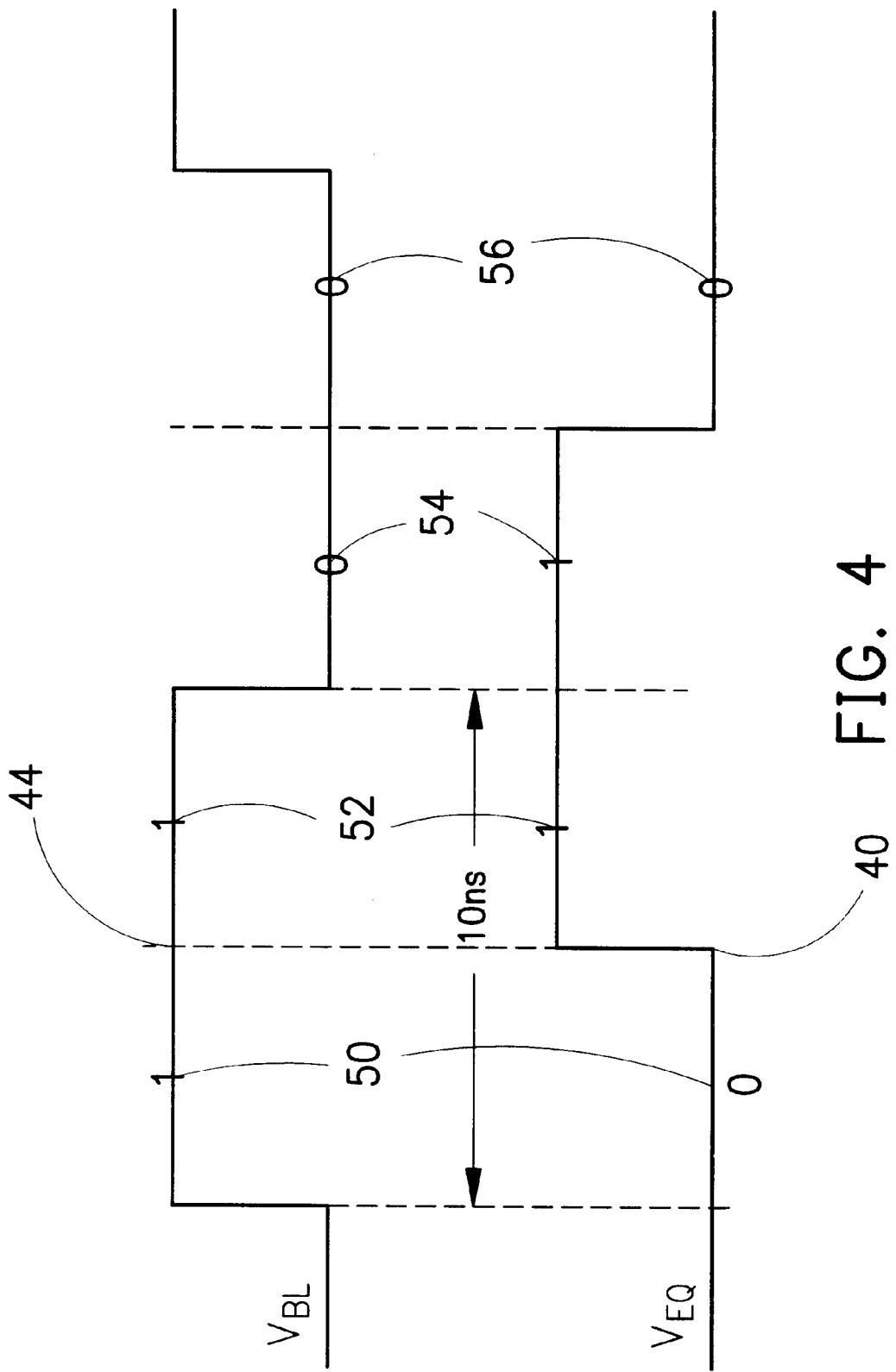
FIG. 4 is a magnified view showing the variation of the bit line voltage and the lower electrode voltage shown in FIG. 3.

The original DC timing in FIG. 2 includes four different combinations of upper electrode (VBL) logic level and lower electrode (VEQ) logic level, corresponding to data write sequence 1/0, 0/0, 1/1 and 0/1. In this invention, an alternate-timing burn-in method is used. FIG. 4 is a magnified view showing the variation of the bit line voltage and the lower electrode voltage shown in FIG. 3. As shown in FIG. 4, the edge 40 of the second bit line voltage clocking signal VEQ corresponds to the mid-point 44 of the first bit line voltage clocking signal VBL. With such clocking arrangement, the data write sequence of the upper electrode (VBL) logic level and the lower electrode (VEQ) logic level is 1/0, 1/1, 0/1 and 0/0. The above operation is capable of maintaining a constant stress for the original timing arrangement but generating alternate-timing properties.

When a station having a highest operating frequency of 10 MHz is used for generating a first bit line voltage clocking signal VBL and a second bit line voltage clocking signal VEQ, maximum resolution of the station is about 10 ns. This corresponds to half a cycle in FIG. 4. For example, in a '1' state operation of the first bit line voltage clocking signal VBL that has a resolution of 10 ns, since the edge 40 of the second bit line voltage clocking signal VEQ corresponds to the mid-point 42 of the first bit line voltage clocking signal VBL, two groups of data are input. Hence, in a cycle (20 ns), four groups of data are input.

Although the highest resolution of the station is only 10 MHz clocking rate under alternate timing is twice that of the highest resolution of the station (that is, 10 ns*2). In other words, the highest resolution of the station is only half. Hence, the clock of an alternate timing burn-in is only 5 MHz. However, since four groups of data are input in one clock cycle, data write has to be multiplied by four. Ultimately, stress frequency of the burn-in test is equivalent to 20 MHz. This frequency is equivalent to twice the highest resolution of the station. From the standpoint of clocking rate, this is equivalent to a four-fold increase. In other words, the invention is able to increase to twice the conventional wafer burn-in efficiency without the need for any additional hardware.

In addition, the wafer burn-in method can be applied to memory units. For example, by applying a first bit line voltage clocking signal VBL to the upper electrode of the capacitor and a second bit line voltage clocking signal to the lower electrode of the capacitor in addition to writing data to the upper electrode terminal (VBL) and the lower electrode terminal (VEQ) with logic pattern in the sequence 1/0, 1/1, 0/1 and 0/0 (labeled 50, 52, 54 and 56 in FIG. 4), a result identical to sequence shown in FIGS. 2A, 2C, 2D and 2B can be obtained. Since the portions 50, 52, 54 and 56 correspond to stressing the bit-line, the bit-line bar, the bit line and the bit-line bar respectively, overall stressing duration is not reduced. Moreover, the stressing is bi-directional with the bit-line and bit-line bar repeatedly stressed. Hence, there is no idling period.

In summary, one major aspect of the wafer burn-in method of this invention is use of an alternating voltage instead of a constant bit line input voltage. Such a conversion is able to increase burn-in frequency and hence burn-in efficiency.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. An alternate-timing burn-in method for testing a memory unit on a wafer, comprising the steps of:

generating a first bit line voltage clocking signal and sending the signal to one terminal of the memory unit; and generating a second bit line voltage clocking signal and sending the signal to the other terminal of the memory unit, wherein the edge of the second bit line voltage clocking signal corresponds to the mid-point of the first bit line voltage clocking signal.

2. The method of claim 1, wherein the highest operating frequency of a burn-in station is used for generating the first bit line voltage clocking signal and the second bit line voltage clocking signal.

3. The method of claim 2, wherein the highest frequency is about 10 MHz.

4. An alternate-timing burn-in method for testing a capacitor on a wafer, comprising the steps of:

generating a first bit line voltage clocking signal and sending the signal to one terminal of the capacitor; and generating a second bit line voltage clocking signal and sending the signal to the other terminal of the capacitor, wherein the edge of the second bit line voltage clocking signal corresponds to the mid-point of the first bit line voltage clocking signal.

5. The method of claim 4, wherein the first bit line voltage clocking signal is sent to the upper electrode of the capacitor and the second bit line voltage clocking signal is sent to the lower electrode of the capacitor.

* * * * *